United States Patent
Li

(10) Patent No.: US 10,379,390 B2
(45) Date of Patent: Aug. 13, 2019

(54) FLEXIBLE SUBSTRATE

(71) Applicant: Shenzhen China Star Optoelectronics Technology Co., Ltd., Shenzhen, Guangdong (CN)

(72) Inventor: Minghui Li, Guangdong (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 238 days.

(21) Appl. No.: 15/534,889

(22) PCT Filed: Apr. 24, 2017

(86) PCT No.: PCT/CN2017/081679
§ 371 (c)(1),
(2) Date: Jun. 9, 2017

(87) PCT Pub. No.: WO2018/188113
PCT Pub. Date: Oct. 18, 2018

(65) Prior Publication Data
US 2019/0094599 A1 Mar. 28, 2019

(30) Foreign Application Priority Data
Apr. 10, 2017 (CN) .......................... 2017 1 0227479

(51) Int. Cl.
*G02F 1/1333* (2006.01)
*G02F 1/13363* (2006.01)

(52) U.S. Cl.
CPC .... *G02F 1/133305* (2013.01); *G02F 1/13363* (2013.01); *Y10T 428/1036* (2015.01); *Y10T 428/1086* (2015.01)

(58) Field of Classification Search
CPC ........... G02F 1/133305; G02F 1/13363; Y10T 428/1023; Y10T 428/1036; Y10T 428/1086
See application file for complete search history.

(56) References Cited

U.S. PATENT DOCUMENTS

| | | | | |
|---|---|---|---|---|
| 5,750,641 | A * | 5/1998 | Ezzell | C08G 73/10 428/1.26 |
| 6,175,400 | B1 * | 1/2001 | Duncan | G02B 5/3016 349/117 |
| 2002/0005925 | A1 * | 1/2002 | Arakawa | G02B 5/3083 349/117 |
| 2009/0185111 | A1 | 7/2009 | Uesaka et al. | |
| 2010/0220273 | A1 | 9/2010 | Nakajima et al. | |
| 2013/0216803 | A1 | 8/2013 | Sun et al. | |

FOREIGN PATENT DOCUMENTS

CN 104903764 A 9/2015

* cited by examiner

*Primary Examiner* — Sophie Hon

(57) ABSTRACT

Disclosed is a flexible substrate, which relates to the technical field of display. The flexible substrate includes a first film and a second film arranged from bottom to top in sequence. The second film is arranged to counteract birefringence effect generated by the first film so as to eliminate phase retardation of the flexible substrate. Thus, display effect can be improved, and impacts on a substrate due to increasing of film thickness can also be avoided. Besides, thickness of the flexible substrate can be determined according to actual needs.

4 Claims, 3 Drawing Sheets

FLEXIBLE SUBSTRATE

CROSS-REFERENCE TO RELATED APPLICATIONS

This application claims the priority of Chinese patent application CN201710227479.6, entitled "Flexible substrate" and filed on Apr. 10, 2017, the entirety of which is incorporated herein by reference.

FIELD OF THE INVENTION

The present disclosure relates to the technical field of display, and in particular, to a flexible substrate.

BACKGROUND OF THE INVENTION

As a main carrier and a material basis for information exchange and transmission, display devices, such as liquid crystal display (LCD) device and organic light emitting diode (OLED) display device, draw attention of more and more people, and are widely used in various aspects of work and life. In recent years, flexible display becomes popular among consumers in the industry, and in particular, industries of flexible thin film transistor liquid crystal display (TFT-LCD) and flexible organic light emitting diode (OLED) have gradually become most promising high-tech industries. Various kinds of flexible display devices, such as television screen, mobile phone screen, wearable device screen, large-sized display screen for business presentations, computer screen and so on, are proposed by different research institutes and enterprises. Liquid crystal display device and organic light emitting diode display device, as two important development fields of the flexible display device, face same problems during development process, i.e., a selection of materials of a flexible substrate and manufacturing thereof.

In order to achieve a flexible display technique, it is required to not only improve design and manufacture techniques but also enhance research, development, and industrialization of various critical materials. The flexible substrate, as a component to support and protect a flexible device, not only has an important influence on display quality of the flexible device but also directly relates to lifetime of the flexible device. Thus, research and development of the flexible substrate is crucial for development of flexible display.

The flexible display device requires a substrate material to have the following properties. (1) The substrate material should have heat resistance and dimensional stability under high temperature, which is determined by a manufacturing procedure of a display screen. High temperature in the manufacturing procedure may cause hot deformation of a substrate, which reduces precision of positioning. Moreover, an excessive variation of a dimension of the substrate may cause unsatisfactory display effect due to an internal stress between surfaces of materials and a separation between layers when the substrate is bent. (2) The substrate material should have flexibility. The development trend of the flexible display device is from a flat type to a bendable type, to a rollable type, and then to a foldable type. A bending radius of the substrate will become increasingly small, and the substrate will become increasingly thin. (3) The substrate material should have a water-proof and oxygen-proof ability. When exposed in an environment of water vapor and oxygen, performance of a display medium of the flexible display device, organic materials in the organic light emitting diode in particular, may degrade rapidly. Thus, water vapor permeability and oxygen permeability of the flexible substrate should be as low as possible. (4) The substrate material should have a flat surface. The surface quality of the substrate, such as roughness degree and clearness degree of the substrate, has a great influence on the mechanical performance of the substrate and the display effect of the display device.

At present, substrate materials of the flexible display device mainly include ultra-thin glass, metallic foil, polymeric film and so on. Considering requirements for the properties of the flexible substrate on the whole, the polymeric film has distinct advantages in optical performance, mechanical performance, chemical performance and so on. Moreover, mass production of the polymeric film can be achieved. Besides, the polymeric film is applicable for a substrate with any size, and the cost thereof is relatively low. Thus, the polymeric film draws wide attention in development of the flexible display device. Commonly used polymer substrate materials include polyethylene glycol terephthalate (PET), polycarbonate (PC), polyimide (PI) and so on. The polyimide substrate material draws great attention for its favorable heat resistance, permeability, mechanical performance, and chemical stability. Rigid polyimide ring of polyimide provides polyimide excellent comprehensive performance, and thus polyimide becomes a first choice of material for the flexible substrate.

However, a traditional polyimide film has great phase retardation. For example, the polyimide film formed by spin coating method has phase retardation in thickness direction, and with increasing of the thickness, the phase retardation increases. That is, the polyimide film has birefringence effect. For the display device, the phase retardation (or birefringence) of a flexible substrate in the thickness direction may easily cause light leakage from a side view direction, which affects the display effect.

SUMMARY OF THE INVENTION

In order to reduce phase retardation and eliminate birefringence effect of a flexible substrate formed by polyimide films in the prior art as well as improve display effect, the present disclosure provides a flexible substrate, comprehensive performance of which is improved. Lightening and thinning of the flexible substrate can be realized, and thus an ultrathin display device can be obtained.

The flexible substrate provided according to the present disclosure comprises a first film and a second film arranged from bottom to top in sequence. The second film is arranged to counteract birefringence effect generated by the first film so as to eliminate phase retardation. According to one preferred embodiment, the first film is a negative polyimide film with an optical axis perpendicular to a surface thereof.

In the flexible substrate, since the second film can counteract the birefringence effect generated by the first film so as to eliminate the phase retardation, impacts on the substrate due to increasing of film thickness can be avoided. In particular, when the first film is a negative polyimide film, i.e., a negative C-Plate polyimide film, the flexible substrate has favorable heat resistance, permeability, mechanical performance, and chemical stability.

As a further improvement on the flexible substrate of the present disclosure, materials forming the second film comprise a positive uniaxial macromolecular material. Since the first film is the negative polyimide film with the optical axis perpendicular to the surface thereof, the second film needs to be formed by a positive uniaxial macromolecular material. The positive uniaxial macromolecular material can counteract the birefringence effect generated by the negative polyimide film so as to eliminate the phase retardation effect and improve the display effect thereof.

Preferably, the positive uniaxial macromolecular material comprises positive uniaxial liquid crystal. Liquid crystal material is a commonly used material in the technical field of display, and the positive uniaxial liquid crystal can counteract the birefringence effect generated by the negative polyimide film. Therefore, when the positive uniaxial liquid crystal is used as the second film, manufacturing difficulty of the substrate can be greatly reduced, and cost thereof can be saved.

According to another preferred embodiment, the second film comprises a positive uniaxial liquid crystal layer and at least one protection film, and the positive uniaxial liquid crystal layer is arranged between the first film and the protection film. The protection film is a negative polyimide film with an optical axis perpendicular to a surface thereof.

Liquid crystal has an anisotropic structure, and can generate birefringence effect. The birefringence effect generated by the positive uniaxial liquid crystal layer can counteract a negative birefringence effect generated by the first film and protection film so as to eliminate the phase retardation and improve the display effect. In this way, impacts on the substrate due to increasing of the film thickness can be avoided. Thus, the number of layers of the protection film can be arranged according to actual needs, and further thickness of the flexible substrate can be determined as required.

As a further improvement on the flexible substrate of the present disclosure, the first film comprises at least one base film. The base film is a negative polyimide film with an optical axis perpendicular to a surface thereof. The second film comprises a positive uniaxial liquid crystal layer and at least one protection film, and the positive uniaxial liquid crystal layer is arranged between the first film and the protection film.

In the flexible substrate with such a structure arrangement, the phase retardation can be eliminated, and the display effect can be improved. Besides, impacts on the substrate due to increasing of the film thickness can be avoided. Thus, the number of layers of the base film and the protection film can be arranged according to actual needs, and further the thickness of the flexible substrate can be determined as required.

As a further improvement on the present disclosure, the second film comprises an equal number of positive uniaxial liquid crystal layers and protection films. The positive uniaxial liquid crystal layers and the protection films are arranged alternately in sequence, and the first film is arranged at a side of the positive uniaxial liquid crystal layers of the second film. Further, the first film is a negative polyimide film with an optical axis perpendicular to a surface thereof. Furthermore, the protection film is a negative polyimide film with an optical axis perpendicular to a surface thereof.

As to the flexible substrate with such an arrangement, the birefringence effect generated by the negative polyimide film can be counteracted by the positive uniaxial liquid crystal layers, and the phase retardation can be eliminated accordingly. The number of the positive uniaxial liquid crystal layer and the protection film can be determined according to requirements for thickness of the substrate.

As a further improvement on the polyimide film, the polyimide, which constitutes the polyimide film, comprises a sulfur group.

A polymer with a high molar refractive index and a low molar volume, comprised in a molecular structure thereof, generally has a high refractive index. Research results show that the refractive index of the polyimide film increases when the sulfur group is introduced into the polyimide film, which increases elemental sulfur in the polyimide film. Besides, flexible thioether chains comprised in the molecular structure of polyimide can effectively inhibit a molecular chain from aligning along a direction of a film surface. Thus, the birefringence effect of the polyimide film can be reduced, and the display effect of the flexible substrate can be improved.

The present disclosure further provides a flexible display panel, which comprises the flexible substrate provided according to the present disclosure.

With respect to the flexible substrate provided according to the present disclosure, the second film is arranged to counteract the birefringence effect generated by the first film so as to eliminate the phase display and improve the display effect. Besides, impacts on the substrate due to increasing of the film thickness can be avoided, and the thickness of the flexible substrate can be determined according to actual needs. Since the flexible display panel comprises the flexible substrate provided in the present disclosure, the display effect thereof can be improved greatly. In addition, an ultrathin design of the flexible display panel can be realized.

BRIEF DESCRIPTION OF THE DRAWINGS

The present disclosure will be described in a more detailed way below based on embodiments and with reference to the accompanying drawings. In the drawings.

Figure 1:
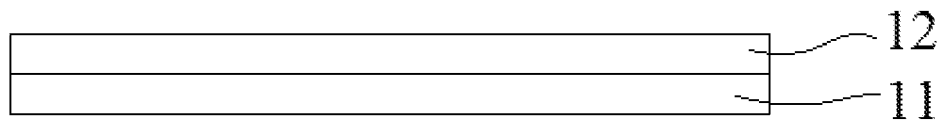
FIG. 1 schematically shows a structure of a flexible substrate according to embodiment 1 of the present disclosure.

In the drawings, the same components are represented by the same reference signs, and the size of each component does not represent the actual size of the corresponding component.

DETAILED DESCRIPTION OF THE EMBODIMENTS

The present disclosure will be described in detail below with reference to the accompanying drawings. In the following text, the terms, such as "top", "bottom", "right" and "left" refer to directions in relation to the drawings, and they should not be understood as restrictions to the present disclosure.

Embodiment 1

FIG. 1 schematically shows a structure of a flexible substrate according to the present embodiment. It can be seen from FIG. 1 that, the flexible substrate comprises a first film 11 and a second film 12 arranged from bottom to top in sequence. The second film 12 is arranged to counteract birefringence effect generated by the first film 11 so as to eliminate phase retardation. When light runs through the first film 11 along a normal line direction, the birefringence effect is generated along a thickness direction of the first film 11, and thus the phase retardation occurs. Moreover, with increasing of thickness of the first film 11, the phase retardation increases, which affects display effect. After the birefringence effect generated by the first film 11 is counteracted by the second film 12, the phase retardation can be eliminated and the display effect can be improved. Besides, impacts on the substrate due to increasing of film thickness can be avoided.

Preferably, the first film 11 is a negative polyimide film with an optical axis perpendicular to a surface thereof. The polyimide film has favorable heat resistance, permeability, mechanical performance, and chemical stability, which further improves quality of the flexible substrate. Materials forming the second film 12 comprise a positive uniaxial macromolecular material. The second film formed by the positive uniaxial macromolecular material can counteract the birefringence effect generated by the negative polyimide film, so that the phase retardation can be eliminated. Preferably, the positive uniaxial macromolecular material is a positive uniaxial liquid crystal material. Liquid crystal material is a commonly used material in the technical field of display, and the positive uniaxial liquid crystal material can counteract the birefringence effect generated by the negative polyimide film. Therefore, when the positive uniaxial liquid crystal material is used as the second film, the manufacturing difficulty can be greatly reduced, and manufacturing cost thereof can be reduced.

Embodiment 2

Figure 2A:
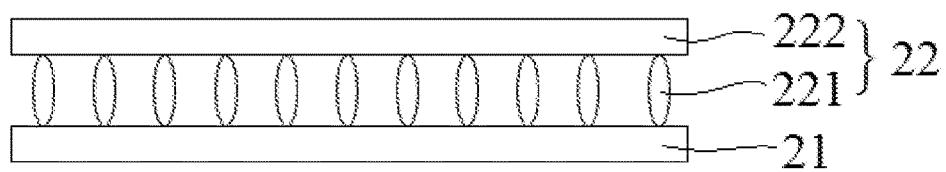
FIG. 2a schematically shows a structure of a flexible substrate which comprises one protection film according to embodiment 2 of the present disclosure.

FIG. 2a schematically shows a structure of a flexible substrate according to the present embodiment. It can be seen from FIG. 2a that, the flexible substrate comprises a first film 21 and a second film 22 arranged from bottom to top in sequence. The second film 22 is arranged to counteract birefringence effect generated by the first film 21 so as to eliminate phase retardation. When light runs through the first film 21 along a normal line direction, the birefringence effect is generated along a thickness direction of the first film 21, and thus the phase retardation occurs. Moreover, with increasing of thickness of the first film 21, display effect is affected. After the birefringence effect generated by the first film 21 is counteracted by the second film 22, the phase retardation can be eliminated and the display effect can be improved. Besides, impacts on the substrate due to increasing of film thickness can be avoided.

It can be seen from FIG. 2a that, the second film 22 further comprises a positive uniaxial liquid crystal layer 221 and at least one protection film 222. The positive uniaxial liquid crystal layer 221 is arranged between the first film 21 and the protection film 222. Preferably, the first film 21 and the protection film 222 are negative polyimide films each with an optical axis perpendicular to a surface thereof. In this way, the flexible substrate according to the present embodiment can be simply understood as being formed by two polyimide films with a same birefringence and a positive uniaxial liquid crystal layer arranged therebetween. The positive uniaxial liquid crystal layer serves as a compensatory film of the polyimide film so as to counteract the phase retardation generated by the polyimide film, whereby the birefringence effect can be eliminated and a viewing angle can be improved.

Figure 2B:
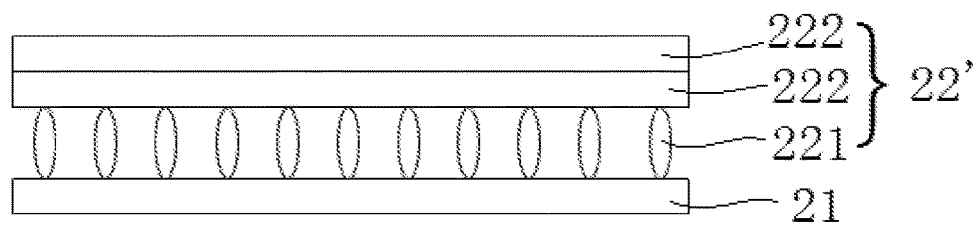
FIG. 2b schematically shows a structure of a flexible substrate which comprises two protection films according to embodiment 2 of the present disclosure.

Since the birefringence effect generated by the first film 21 can be eliminated by the second film 22, impacts on the substrate due to increasing of the film thickness can be avoided. Thus, according to the present embodiment, the number of the protection film 222 can be arranged according to actual needs so as to change thickness of the flexible substrate. FIG. 2b schematically shows a structure of a flexible substrate which comprises two protection films according to the present embodiment.

Embodiment 3

Figure 3A:
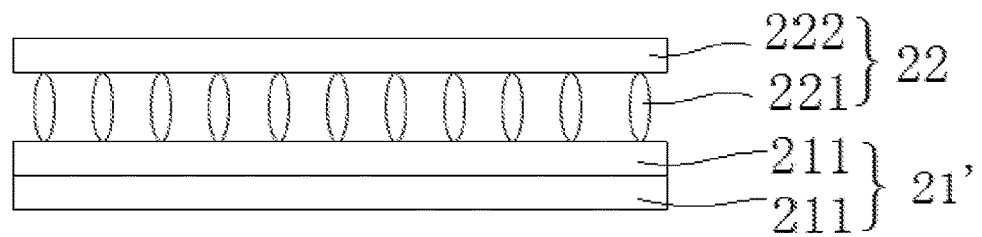
FIG. 3a schematically shows a structure of a flexible substrate which comprises two base films and one protection film according to embodiment 3 of the present disclosure.

FIG. 3a schematically shows a structure of a flexible substrate according to the present embodiment. The present embodiment differs from embodiment 2 in that, the first film 21 comprises at least one base film 211. Preferably, the base film 211 is a negative polyimide film with an optical axis perpendicular to a surface thereof.

Figure 3B:
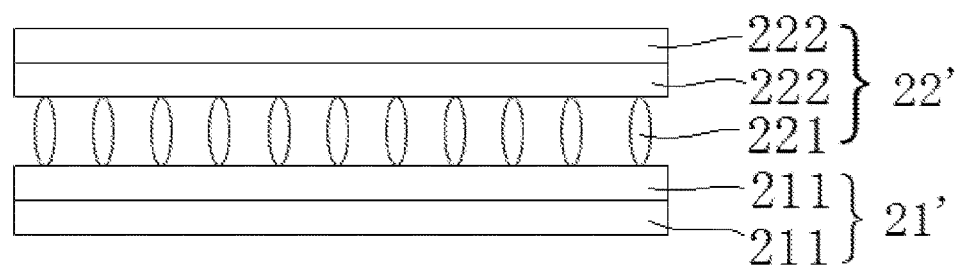
FIG. 3b schematically shows a structure of a flexible substrate which comprises two base films and two protection films according to embodiment 3 of the present disclosure.

The flexible substrate in the present embodiment can achieve a same technical effect as that of the flexible substrate in embodiment 2. According to the present embodiment, the number of the base film 211 and the number of the protection film 222 can both be arranged so as to change the thickness of the flexible substrate. FIG. 3b schematically shows a structure of a flexible substrate which comprises two base films 211 and two protection films 222 according to the present embodiment.

Embodiment 4

According to the present embodiment, any one of the structures of the flexible substrate according to embodiments 1 to 3 can be used. A difference is that the polyimide, which constitutes the polyimide film, comprises a sulfur group. Research results show that the refractive index of the polyimide film increases when the sulfur group is introduced into the polyimide film, which increases elemental sulfur in the polyimide film. Besides, flexible thioether chains comprised in the molecular structure of polyimide can effectively inhibit a molecular chain from aligning along a direction of a film surface. Thus, the birefringence effect of the polyimide film can be reduced, and the display effect of the flexible substrate can be improved.

Embodiment 5

Figure 4:
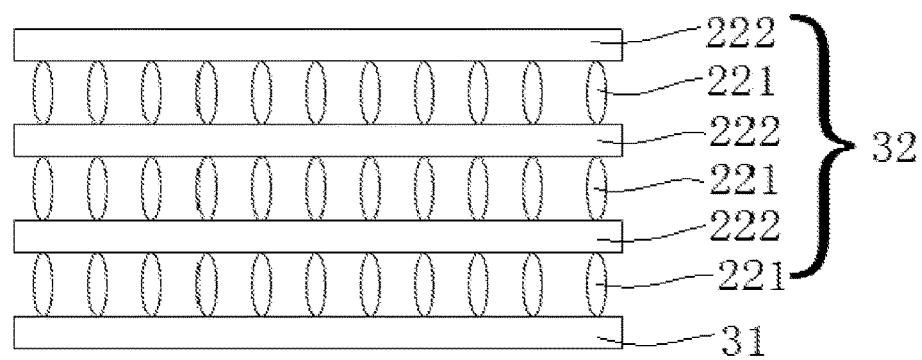
FIG. 4 schematically shows a structure of a flexible substrate according to embodiment 5 of the present disclosure.

FIG. 4 schematically shows a structure of a flexible substrate according to the present embodiment. It can be seen from FIG. 4 that, the second film 32 comprises an equal number of positive uniaxial liquid crystal layers 221 and protection films 222, which are arranged alternately in sequence, and the first film 31 is arranged at a side of the positive uniaxial liquid crystal layers 221 of the second film 32. Preferably, the first film 31 is a negative polyimide film with an optical axis perpendicular to a surface thereof. Preferably, the protection film 222 is a negative polyimide film with an optical axis perpendicular to a surface thereof. Based on contents of embodiments 1 to 4, it is obvious that the protection film according to the present embodiment can be arranged as multiple overlaying layers of negative C-Plate polyimide film, and that the second film 32 can also be arranged as multiple overlaying layers of negative C-Plate polyimide film. Likewise, the polyimide, which constitutes the polyimide film, can also comprises a sulfur group.

As to the flexible substrate with such an arrangement, the birefringence effect generated by the negative polyimide film can be counteracted by the positive uniaxial liquid crystal layers, and thus the phase retardation can be eliminated. The number of the positive uniaxial liquid crystal layer and the protection film can be arranged according to requirements of thickness of the substrate.

The above embodiments are described only for better understanding, rather than restricting the technical solution of present disclosure. Although the present disclosure is described in detail with reference to better embodiments, those ordinary skilled in the art should understand that the technical solution of the present disclosure can be amended or replaced with equivalents. In particular, as long as there is no structural conflict, features in respective embodiments can be combined with one another, and the obtained combined features still fall into the scope of the present disclosure. Combinations of features should fall into the scope of the present disclosure as long as they do not depart from the spirit and scope of the present disclosure.

The invention claimed is:

1. A display device comprising a flexible substrate in which the birefringence effect or the phase retardation is eliminated, the flexible substrate comprising a first film and a second film arranged from bottom to top in sequence, wherein the second film is arranged to counteract birefringence effect generated by the first film so as to eliminate phase retardation;
    wherein the first film is a negative polyimide film with an optical axis perpendicular to a surface thereof;
    wherein the second film comprises a positive uniaxial liquid crystal layer and at least one protection film, and the positive uniaxial liquid crystal layer is arranged between the first film and the protection film;
    wherein the at least one protection film is a negative polyimide film with an optical axis perpendicular to a surface thereof, and is configured to change a thickness of the flexible substrate.

2. The display device according to claim 1, wherein the polyimide, which constitutes the polyimide film, comprises a sulfur group.

3. A display device comprising a flexible substrate in which the birefringence effect or the phase retardation is eliminated, the flexible substrate comprising a first film and a second film arranged from a bottom to a top in sequence, wherein the second film is arranged to counteract birefringence effect generated by the first film so as to eliminate phase retardation;
    wherein the first film is a negative polyimide film with an optical axis perpendicular to a surface thereof;
    wherein the second film comprises an equal number of positive uniaxial liquid crystal layers and protection films which are arranged alternately in sequence, and the first film is arranged at a side of the positive uniaxial liquid crystal layers of the second film;
    wherein each protection film is a negative polyimide film with an optical axis perpendicular to a surface thereof, and is configured to change a thickness of the flexible substrate.

4. The display device according to claim 3, wherein the polyimide, which constitutes the polyimide film, comprises a sulfur group.

* * * * *